United States Patent
Yoshida

(10) Patent No.: US 8,881,386 B2
(45) Date of Patent: Nov. 11, 2014

(54) POWER MODULE PRODUCTION METHOD, AND POWER MODULE PRODUCED THEREBY

(75) Inventor: Yuji Yoshida, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 3 days.

(21) Appl. No.: 13/520,820

(22) PCT Filed: Dec. 20, 2010

(86) PCT No.: PCT/JP2010/007356
§ 371 (c)(1),
(2), (4) Date: Jul. 6, 2012

(87) PCT Pub. No.: WO2011/086641
PCT Pub. Date: Jul. 21, 2011

(65) Prior Publication Data
US 2013/0027888 A1    Jan. 31, 2013

(30) Foreign Application Priority Data
Jan. 13, 2010    (JP) ................................. 2010-004908

(51) Int. Cl.
*H05K 3/34* (2006.01)
*H01L 23/24* (2006.01)
(Continued)

(52) U.S. Cl.
CPC ................ *H05K 7/209* (2013.01); *H01L 23/24* (2013.01); *H01L 23/3735* (2013.01); *H01L*
(Continued)

(58) Field of Classification Search
USPC ......... 29/592.1, 825, 829, 832, 840; 361/715, 361/704, 688, 679.01, 600, 790; 228/176, 228/101
See application file for complete search history.

(56) References Cited

U.S. PATENT DOCUMENTS

| | | | |
|---|---|---|---|
| 6,906,935 B2 * | 6/2005 | Nakamura et al. ............ 363/144 |
| 2003/0090915 A1 | 5/2003 | Nakamura et al. |
| 2006/0152912 A1 | 7/2006 | Karrer et al. |

FOREIGN PATENT DOCUMENTS

| | | |
|---|---|---|
| CN | 101472449 | 7/2009 |
| DE | 10 2005 001 148 B3 | 5/2006 |

(Continued)

OTHER PUBLICATIONS

International Search Report in International Application No. PCT/JP2010/007356; Mailing Date: May 26, 2011.

(Continued)

*Primary Examiner* — Peter DungBa Vo
*Assistant Examiner* — Azm Parvez
(74) *Attorney, Agent, or Firm* — Finnegan, Henderson, Farabow, Garrett & Dunner, LLP

(57) ABSTRACT

There is provided a power module production method that is capable of stably producing a power module with highly reliable properties, and so forth. The power module production method produces a power module 1 by stacking a cooler 5, an insulating resin sheet 4, a heat sink block 3, and a semiconductor chip 2, wherein a first insulating resin sheet 41, which forms a lower layer of the insulating resin sheet 4, is first bonded to the cooler 5 by thermal compression. Next, with a second insulating resin sheet 42, which forms an upper layer of the insulating resin sheet 4, interposed between the first insulating resin sheet 41 and the heat sink block 3, the second insulating resin sheet 42 is bonded to the first insulating resin sheet 41 by thermal compression, and the heat sink block 3 is bonded to the second insulating resin sheet 42 by thermal compression. The semiconductor chip 2 is then soldered onto the heat sink block 3. Thus, bonding defects at the respective bonding interfaces are prevented, and dielectric breakdown of the insulating resin sheet 4 is prevented.

2 Claims, 4 Drawing Sheets

(51) Int. Cl.
  *H05K 7/20*    (2006.01)
  *H01L 23/373*  (2006.01)
  *H01L 23/42*   (2006.01)

(52) U.S. Cl.
  CPC .............. 2224/48091 (2013.01); *H01L 23/42* (2013.01); *H05K 7/20472* (2013.01); *H01L 2224/92247* (2013.01); *H01L 2224/73265* (2013.01)
  USPC ............ 29/840; 29/592.1; 29/825; 29/829; 29/832; 361/715; 361/704; 361/688; 361/679.01; 361/600; 228/176; 228/101

(56) References Cited

FOREIGN PATENT DOCUMENTS

| | | | |
|---|---|---|---|
| EP | 0 790 762 A2 | 8/1997 | |
| JP | 2003-153554 | 5/2003 | |
| JP | 2005057108 A * | 3/2005 | ............. H01L 25/07 |
| WO | WO 2006/118211 A1 | 11/2006 | |

OTHER PUBLICATIONS

Written Opinion of the International Searching Authority in International Application No. PCT/JP2010/007356; Mailing Date: May 26, 2011.

* cited by examiner

FIG. 2

|  | Article of present invention | | Prior art article | |
| --- | --- | --- | --- | --- |
|  | Initial | After 3,000 cycs | Initial | After 3,000 cycs |
| Cooler/Insulating resin sheet bonding rate | 100% | 100% | 100% | 93% |
| Heat sink block/insulating resin sheet bonding rate | 100% | 100% | 100% | 86% |
| Internal cracks in insulating resin sheet | None | None | Present | Present |
| Dielectric breakdown voltage@AC50Hz | >5kV | >5kV | <2kV | <2kV |

(a) PRIOR ART (b) PRIOR ART (c) PRIOR ART

POWER MODULE PRODUCTION METHOD, AND POWER MODULE PRODUCED THEREBY

CROSS-REFERENCE TO RELATED APPLICATIONS

This application is a national phase application of International Application No. PCT/JP2010/007356, filed Dec. 20, 2010, and claims the priority of Japanese Application No. 2010-004908, filed Jan. 13, 2010, the content of both of which is incorporated herein by reference.

TECHNICAL FIELD

The present invention relates to a power module production method for a power module comprising a semiconductor chip, a heat sink block, an insulating resin sheet, and a cooler, as well as to a power module produced by such a method.

BACKGROUND ART

As a method for producing a power module, such as an inverter device, etc., there is known a power module production method, wherein a semiconductor chip is first soldered to a heat sink, and the heat sink and a cooler are then bonded by thermal compression with an insulating resin sheet interposed between the heat sink and the cooler (see, for example, Patent Literature 1).

FIG. 3 is a schematic view illustrating a conventional power module production method. First, as shown in FIG. 3(a), a semiconductor chip 101 is soldered to a heat sink block 102 (soldering step). The heat sink block 102 comprises a plate-shaped member that is larger than the semiconductor chip 101, and the semiconductor chip 101 is soldered at an approximately central location on one side thereof. Soldering is performed through, for example, solder reflow, wherein the semiconductor chip 101 and the heat sink block 102 as a whole are evenly heated (overall heating) to the melting temperature of the solder within a reflow oven.

Next, as shown in FIG. 3(b), a step of bonding the heat sink block 102 to a cooler 104 by thermal compression (thermal compression bonding step) is performed with an insulating resin sheet 103 interposed between the heat sink block 102 and the cooler 104. The insulating resin sheet 103 comprises a sheet-shaped member that is larger than the heat sink block 102, and the heat sink block 102 is bonded at approximately the center of the insulating resin sheet 103 by thermal compression. Thermal compression bonding is performed by pressing the heat sink block 102 and the lateral portions of the insulating resin sheet 103 that protrude sideways from the heat sink block 102 against the cooler 104 under heated conditions.

Then, as shown in FIG. 3(c), the semiconductor chip 101 and terminals are connected with a wire 105 (wire bonding step), and a step of burying the semiconductor chip 101 within a housing 107 by means of an encapsulation material 106 (molding step) is performed.

CITATION LIST

Patent Literature

PTL 1: Japanese Patent Publication (Kokai) No. 2003-153554 A

SUMMARY OF INVENTION

Technical Problem

If, in the thermal compression bonding step, the semiconductor chip 101 is pressed together with the heat sink block 102, the semiconductor chip 101 could become damaged. As such, in bonding the heat sink block 102 and the cooler 104 by thermal compression, the semiconductor chip 101 cannot be pressed, and conventional practice has been to partially press the marginal portions of the heat sink block 102 that protrude further sideways than the semiconductor chip 101, as well as the lateral portions of the insulating resin sheet 103 that protrude further sideways than the heat sink block 102 as indicated with arrows in FIG. 3(b).

Thus, the whole of the heat sink block 102 cannot be pressed with an even pressure, there is a risk that unbonded portions or bonding unevenness may occur in the bonding interface between heat sink block 102 and the insulating resin sheet 103 or in the bonding interface between the insulating resin sheet 103 and the cooler 104, and there is a problem which is that the reliability of such properties of the power module 100 as dielectric strength, thermal resistance, etc., are compromised.

In addition, partially pressing the marginal portions of the heat sink block 102 and the lateral portions of the insulating resin sheet 103 while staying clear of the semi-conductor chip 101 was technically difficult and called for dedicated pressing jigs tailored to the shapes of the semiconductor chip 101 and the heat sink block 102, which resulted in a commensurate cost increase for making such jigs.

FIG. 4 is an enlarged view of portion A in FIG. 3(b). Due to cost considerations, the heat sink block 102 is often produced by press-punching. A heat sink block 102 produced by press-punching is such that an end edge on one side is not of a right-angled cross-section, but rather a curved surface 102a with an arc-shaped cross-section and which is curved in a convex shape with a certain degree of curvature. Further, for purposes of stress relaxation, the heat sink block 102 has one face having an end edge of the curved surface 102a so disposed as to be in surface contact with the insulating resin sheet 103.

A gap is thus formed between the end edge of the heat sink block 102 and the insulating resin sheet 103. When the heat sink block 102 and the lateral portions of the insulating resin sheet 103 are simultaneously pressed using a dedicated pressing jig 111 in order to perform thermal compression bonding, there occurs locally in the insulating resin sheet 103 along the end edge of the heat sink block 102 an area 103a which physically cannot be pressed.

Further, in order to escape the pressure exerted by the pressing, the resin located in the vicinity of the area 103a of the insulating resin sheet 103 will try to gather at the area 103a, and stress will become concentrated. Consequently, a crack 103b may occur in the area 103a of the insulating resin sheet 103, and there is a risk that dielectric breakdown may occur therefrom, thus compromising the insulation reliability of the power module 100.

In addition, there is a risk that the thermal resistance reliability of a solder 101a may be compromised due to the thermal compression bonding and curing of the insulating resin sheet 103. For example, since the temperature for the thermal compression bonding and curing of the insulating resin sheet 103 falls between 150 degrees C. and 200 degrees C., which is higher than the maximum operating temperature (the temperature the solder is subjected to during actual use) of 150 degrees C. for Si semiconductors (semiconductor chips) that are mainstream today, there is a risk that degradation of the solder 101a may progress rapidly.

The present invention is made in view of the points discussed above, and an object thereof is to provide a power module production method that is capable of stably producing a power module with highly reliable properties, as well as to provide a power module that is produced by such a method.

Solution to Problem

A power module production method of the present invention that solves the problems mentioned above is a power module production method for producing a power module by stacking a cooler, an insulating resin sheet, a heat sink block, and a semiconductor chip, the method' comprising: a first thermal compression bonding step in which a first insulating resin sheet, which forms a lower layer of the insulating resin sheet, is bonded to the cooler by thermal compression; a second thermal compression bonding step in which a second insulating resin sheet, which forms an upper layer of the insulating resin sheet, is interposed between the first insulating resin sheet and the heat sink block, the second insulating resin sheet is bonded to the first insulating resin sheet by thermal compression, and the heat sink block is bonded to the second insulating resin sheet by thermal compression; and a soldering step in which the semiconductor chip is soldered onto the heat sink block.

According to a power module production method of the present invention, because thermal compression bonding steps are first performed, and a soldering step thereafter, it is possible to evenly press the whole of the first insulating resin sheet in bonding the first insulating resin sheet to the cooler by thermal compression. Further, it is possible to evenly press the whole of the heat sink block in bonding the second insulating resin sheet to the first insulating resin sheet by thermal compression and in bonding the heat sink block to the second insulating resin sheet by thermal compression with the second insulating resin sheet interposed between the first insulating resin sheet and the heat sink block.

Thus, it is possible to prevent bonding unevenness and unbonded portions due to insufficient pressure from occurring in the respective bonding interfaces between the cooler and the first insulating resin sheet, between the first insulating resin sheet and the second insulating resin sheet, and between the second insulating resin sheet and the heat sink block.

In particular, since, in the second thermal compression bonding step, it is possible to press the heat sink block in a state where the first insulating resin sheet has been completely bonded to the cooler by thermal compression, it is possible to prevent occurrences of lifting, wherein the marginal portions of the first insulating resin sheet become separated from the upper surface of the cooler, and occurrences of cracks in the first insulating resin sheet which result from the pressing of the heat sink block.

In addition, in the second thermal compression bonding step, it is possible to press the heat sink block alone. Thus, unlike a case where both the heat sink block and the lateral portions of the insulating resin sheet are pressed simultaneously as is conventionally done, it is possible to prevent local concentration of stress in the insulating resin sheet along the end edges of the heat sink block. Therefore, it is possible to prevent cracks from occurring at sites of concentrated stress, wherefrom dielectric breakdown may occur, thus making it possible to enhance dielectric strength. In addition, because thermal compression bonding steps are performed prior to the soldering step, it is possible to prevent a drop in the thermal resistance reliability of the solder due to the heat from the thermal compression bonding. Thus, it is possible to produce a power module with highly reliable properties.

With respect to a power module production method of the present invention, it is preferable that the first insulating resin sheet and the second insulating resin sheet both comprise a thermosetting resin material, that thermal compression bonding be performed in the first thermal compression bonding step by heating to a temperature at which the first insulating resin sheet cures thermally, and that thermal compression bonding be performed in the second thermal compression bonding step by heating to a temperature at which the second insulating resin sheet cures thermally.

Further, with respect to a power module production method of the present invention, it is preferable that the first insulating resin sheet have a size that is greater than that of the heat sink block and a thickness that is equal to or greater than the thickness of the second insulating resin sheet.

Advantageous Effects of Invention

According to a power module production method of the present invention, thermal compression bonding steps are first performed, and a soldering step thereafter. Thus, in bonding the first insulating resin sheet to the cooler by thermal compression, it is possible to evenly press the whole of the first insulating resin sheet. Further, in bonding the second insulating resin sheet to the first insulating resin sheet by thermal compression and in bonding the heat sink block to the second insulating resin sheet by thermal compression with the second insulating resin sheet interposed between the first insulating resin sheet and the heat sink block, it is possible to evenly press the whole of the heat sink block. Thus, it is possible to prevent bonding unevenness and unbonded portions due to insufficient pressure from occurring at the respective bonding interfaces between the cooler and the first insulating resin sheet, between the first insulating resin sheet and the second insulating resin sheet, and between the second insulating resin sheet and the heat sink block, and it is possible to produce a power module with highly reliable properties.

BRIEF DESCRIPTION OF DRAWINGS

FIG. 2 is a diagram showing in the form of a comparative table the test results of temperature cycling for an article of the present invention and a prior art article.

DESCRIPTION OF EMBODIMENTS

An embodiment of the present invention will now be described with reference to FIG. 1.

Figure 1:
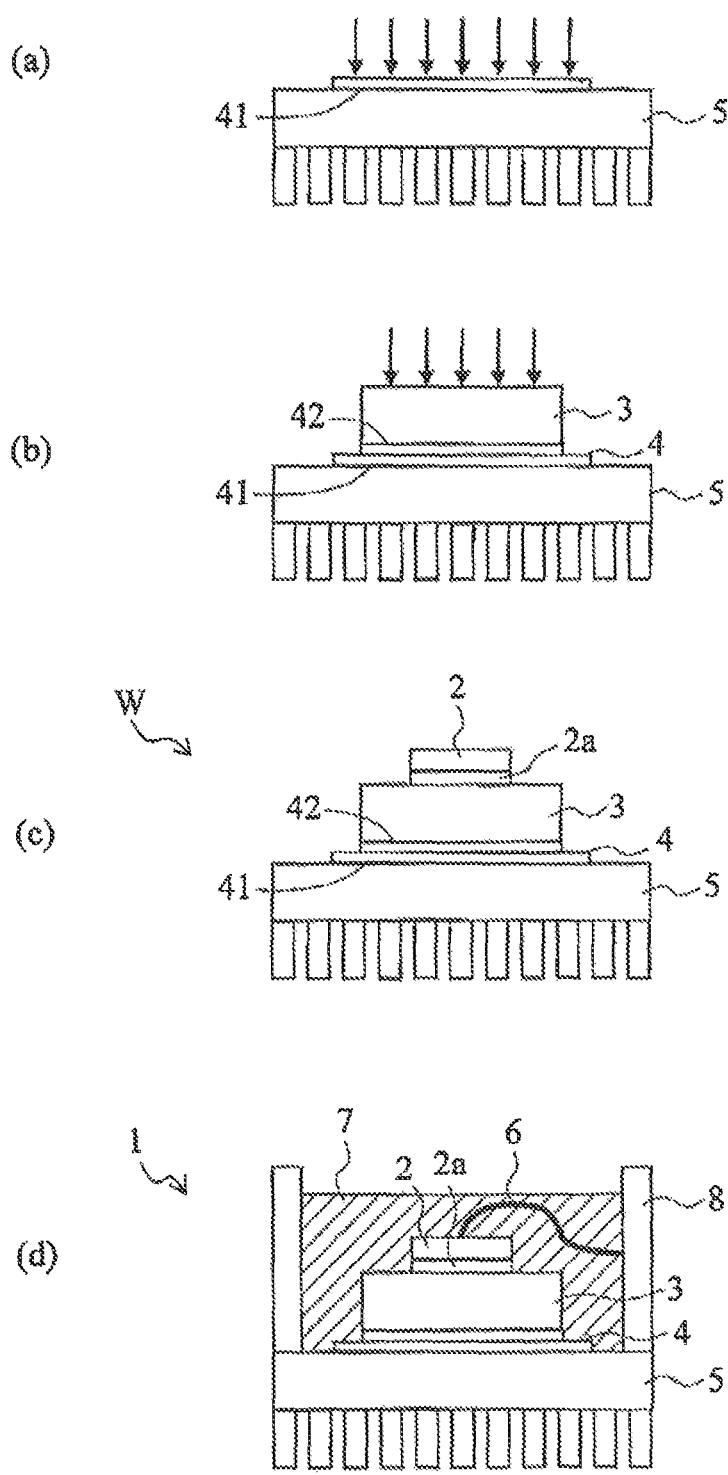
FIG. 1 is a view illustrating a power module production method according to an embodiment.

FIG. 1 is a view illustrating a power module production method in the present embodiment.

As shown in FIG. 1(d), a power module 1 is configured by stacking a semiconductor chip 2, a heat sink block 3, an insulating resin sheet 4, and a cooler 5. The semiconductor chip 2 is of a thin plate shape that is approximately rectangular in plan view, and solder 2a is provided in advance on the lower surface thereof. The heat sink block 3 comprises a planar member of a size greater than that of the semiconductor chip 2. The insulating resin sheet 4 comprises a first insulating resin sheet 41 that forms the lower layer of the insulating resin sheet 4, and a second insulating resin sheet 42 that forms the upper layer of the insulating resin sheet 4. The first insulating resin sheet 41 comprises a sheet-shaped member of a size greater than that of the heat sink block 3, and the second insulating resin sheet 42 comprises a sheet-shaped member of a size equal to or greater than that of the heat sink block 3. The cooler 5 comprises a plate-shaped member of a size greater than that of the first insulating resin sheet 41.

Although the heat sink block 3 and the cooler 5 are not limited to any material in particular, considering cost, weight and heat conductivity, it is preferable that the heat sink block 3 be copper (Cu), and the cooler 5 an aluminum alloy (Al). For the heat sink block 3, as a thickness that is sufficient for diffusing the heat from the semiconductor chip 2 and conducting it to the insulating resin sheet 4, 1 mm or above is preferred. Further, it is also possible to adopt a configuration for reducing thermal stress at the time of soldering by having the heat sink block 3 and the cooler 5 comprise the same material, thereby making their linear expansion coefficients be the same.

The insulating resin sheet 4 comprises a material in which, for example, 10-70% by weight of a thermoplastic resin or thermosetting resin (epoxy resin, polyimide resin, silicon resin, etc.) is used as a binder, and 30-90% by weight of an insulating inorganic filler (alumina, boron nitride, etc.) with high thermal conductivity is contained as a filler. Further, it is preferable that thermal conductivity lambda be 5 W/mK or greater, and that the combined thickness of the first insulating resin sheet 41 and the second insulating resin sheet 42, from the perspective of attaining both reliability of electrical insulation and low thermal resistance, meet a predetermined requisite thickness of 0.1-0.3 mm.

Next, a production method for the power module 1 in the present embodiment will be described. A production method for the power module 1 comprises, as shown in FIG. 1: a first thermal compression bonding step (FIG. 1(*a*)); a second thermal compression bonding step (FIG. 1(*b*)); a soldering step (FIG. 1(*c*)); and wire bonding and molding steps (FIG. 1(*d*)).

In the first thermal compression bonding step, there is performed an operation where the first insulating resin sheet 41 is bonded to the cooler 5 by thermal compression. Specifically, the first insulating resin sheet 41 is mounted approximately at the center on the upper surface of the cooler 5, the cooler 5 and the first insulating resin sheet 41 are heated to a predetermined temperature (to the thermal curing temperature of the first insulating resin sheet 41 if the first insulating resin sheet 41 is a thermosetting resin), and the first insulating resin sheet 41 is pressed against the cooler 5, thereby bonding the first insulating resin sheet 41 to the cooler 5. In bonding the first insulating resin sheet 41 by thermal compression, the whole of the first insulating resin sheet 41 is evenly pressed. It is thus possible to prevent bonding unevenness and unbonded portions due to insufficient pressure from occurring at the bonding interface between the cooler 5 and the first insulating resin sheet 41.

In the second thermal compression bonding step, there is performed an operation where, with the second insulating resin sheet 42 interposed between the first insulating resin sheet 41 and the heat sink block 3, the second insulating resin sheet 42 is bonded to the first insulating resin sheet 41 by thermal compression, while the heat sink block 3 is bonded to the second insulating resin sheet 42 by thermal compression.

Specifically, the second insulating resin sheet 42 is mounted approximately at the center on the upper surface of the first insulating resin sheet 41 and, further, the heat sink block 3 is mounted on the upper surface of the second insulating resin sheet 42, thereby creating a state where the second insulating resin sheet 42 is interposed between the first insulating resin sheet 41 and the heat sink block 3.

Then, the heat sink block 3 is pressed against the cooler 5 while the cooler 5, the first insulating resin sheet 41, the second insulating resin sheet 42 and the heat sink block 3 are heated to a predetermined temperature (to the thermal curing temperature of the second insulating resin sheet 42 if the second insulating resin sheet 42 is a thermosetting resin), thereby bonding the second insulating resin sheet 42 to the first insulating resin sheet 41 and the heat sink block 3 to the second insulating resin sheet 42.

In bonding the heat sink block 3 by thermal compression, the whole of the heat sink block 3 is evenly pressed. It is thus possible to prevent bonding unevenness and unbonded portions due to insufficient pressure from occurring at the bonding interface between first insulating resin sheet 41 and the second insulating resin sheet 42 and at the bonding interface between the second insulating resin sheet 42 and the heat sink block 3. The first thermal compression bonding step and the second thermal compression bonding step respectively of FIGS. 1(*a*) and (*b*) mentioned above are performed by means of a thermal compression bonding device (shown in neither of the figures), such as a press machine comprising a heating means and a pressing means, etc.

Next, in the soldering step shown in FIG. 1(*c*), there is performed an operation where the semiconductor chip 2 is soldered to the heat sink block 3. Soldering is performed by means of solder reflow. In solder reflow, the semiconductor chip 2 is first mounted approximately at the center on the upper surface of the heat sink block 3, and this is placed within a reflow oven of a soldering device (not shown). Then, heating is performed within the reflow oven to melt solder 2*a* that is provided on the lower surface of the semiconductor chip 2 in advance, thereby soldering the semiconductor chip 2 onto the upper surface of the heat sink block 3.

In the soldering step of the present embodiment, in order to reduce the thermal stress experienced by the insulating resin sheet 4 at the time of soldering, instead of evenly heating the whole of a work W comprising the cooler 5, the insulating resin sheet 4, the heat sink block 3 and the semiconductor chip 2, there is performed a differential heat treatment where the side of the semiconductor chip 2 is brought to a higher temperature than the side of the cooler 5.

In the differential heat treatment, for example, the side of the semiconductor chip 2 may be heated with the whole of the work W so positioned that the semiconductor chip 2 is located to the side of the heater within the reflow oven. Alternatively, the semiconductor chip 2 may also be heated locally through high-frequency induction heating, etc. Further, in order to prevent a rise in temperature on the side of the cooler 5, for example, a low-temperature heater of a lower heating temperature than the above-mentioned heater may be provided, or a cooling means, such as a metal block with a high heat capacity, etc., may be disposed.

The soldering temperature (200 degrees C. or above) is higher than the thermal compression bonding temperature for the insulating resin sheet 4, is approximately comparable to the temperature at which epoxy resins begin to degrade (approximately 250 degrees C. to 300 degrees C.), and is a temperature that is higher than the glass transition temperatures (both of which are approximately 150 degrees C. to 200 degrees C.). Thus, if an overall heat treatment that heats the whole of the work W were to be performed in the soldering step, the stress due to a difference in linear expansion between the heat sink block 3 and the cooler 5 would increase rapidly, thereby possibly causing separation at the bonding interface between the cooler 5 and the first insulating resin sheet 41 or at the bonding interface between the first insulating resin sheet 41 and the second insulating resin sheet 42.

As such, in the present embodiment, soldering is performed through a differential heat treatment, thereby reducing the thermal stress experienced by the first insulating resin sheet 41 and the second insulating resin sheet 42 at the time of soldering, and improving the reliability of the bonding interfaces.

Further, if a highly reliable Pb-free solder, which is mainstream today, is to be used, since the melting temperatures of Pb-free solders are higher than those of ordinary solders, production may not be carried out by heating the whole of the work W to the soldering temperature as is done in conventional solder reflow. However, in the present embodiment, through a differential heat treatment, it is possible to prevent the insulating resin sheet 4 from reaching high temperatures, and it is possible to appropriately solder the semiconductor chip 2.

Further, if thermal compression bonding were to be performed by heating the whole of the work W, the resin in the insulating resin sheet 4 would vaporize and adhere to the surface of the chip, thereby possibly causing bonding defects, etc., in the wire bonding step (FIG. 1(d)) which is the next step. However, in the present embodiment, through a differential heat treatment, it is possible to suppress vaporization of the resin in the insulating resin sheet 4, and to prevent bonding defects, etc., from occurring in the wire bonding step.

Then, the wire bonding step and the molding step (FIG. 1(d)) are performed. In the wire bonding step, the semiconductor chip 2 and terminals are connected with a wire 6. In the molding step, the semiconductor chip 2, the heat sink block 3 and the insulating resin sheet 4 are buried within a housing 8 with an encapsulation material 7. Since the wire bonding step and the molding step are similar to those of known techniques, detailed descriptions thereof are herein omitted.

According to the above-mentioned power module production method of the present invention, because the cooler 5 and the heat sink block 3 are first bonded by thermal compression, and the semiconductor chip 2 is thereafter soldered onto the heat sink block 3, in bonding the first insulating resin sheet 41 to the cooler 5 by thermal compression, it is possible to evenly press the whole of the first insulating resin sheet 41. Further, in interposing the second insulating resin sheet 42 between the first insulating resin sheet 41 and the heat sink block 3, bonding the second insulating resin sheet 42 to the first insulating resin sheet 41 by thermal compression, and bonding the heat sink block 3 to the second insulating resin sheet 42 by thermal compression, it is possible to evenly press the whole of the heat sink block 3.

Thus, it is possible to prevent bonding unevenness and unbonded portions due to insufficient pressure from occurring at the respective bonding interfaces between the cooler 5 and the first insulating resin sheet 41, between the first insulating resin sheet 41 and the second insulating resin sheet 42, and between the second insulating resin sheet 42 and the heat sink block 3.

In particular, in the second bonding step (FIG. 1(b)), since it is possible to press the heat sink block 3 in a state where the cooler 5 and the first insulating resin sheet 41 are completely bonded, it is possible to prevent occurrences of cracks in the first insulating resin sheet 41 and lifting, where the marginal portions of the first insulating resin sheet 41 becomes separated from the upper surface of the cooler 5, that result from the pressing of the heat sink block 3.

Further, in the second bonding step, it is possible to press the heat sink block 3 alone. Thus, unlike cases where both the heat sink block and the lateral portions of the insulating resin sheet are simultaneously pressed as is conventionally done, it is possible to prevent stress from partially concentrating at the insulating resin sheet along the end edges of the heat sink block. It is thus possible to prevent cracks from occurring at sites where stress is concentrated and causing dielectric breakdown therefrom, and to improve dielectric strength. It is thus possible to produce a power module with highly reliable properties.

In addition, since the first and second thermal compression bonding steps (FIGS. 1(a) and (b)) are performed prior to the soldering step (FIG. 1(c)), it is possible to prevent drops in the heat resistance reliability of the solder due to the heat from thermal compression bonding.

Further, in the soldering step, by performing soldering through a differential heat treatment instead of an overall heat treatment, thereby reducing the thermal stress experienced by the insulating resin sheet 4 at the time of soldering, it is possible to prevent separation at the bonding interfaces. It is thus possible to produce the power module 1 with highly reliable properties.

According to the above-mentioned power module production method, conventionally existing devices may be used as press machines, jigs, etc., for thermal compression bonding, thus providing for easy implementation.

EXAMPLES

An example of the present invention will now be described. In the present example, the power module 1 was produced under the following conditions.

(1) First Thermal Compression Bonding Step

The first insulating resin sheet 41 was bonded to the cooler 5 by thermal compression under the following conditions: 180 degrees C., five minutes, and 5 MPa. For the first insulating resin sheet 41, one that comprised a thermosetting resin, of which each side was longer than the heat sink block 3 by 4 mm in order to secure lateral portions that protruded further sideways than the heat sink block 3 by 2 mm, and whose thickness t was 0.1 mm was used. The first insulating resin sheet 41 had half the thickness of a predetermined requisite thickness required of the insulating resin sheet 4.

(2) Second Thermal Compression Bonding Step

With the second insulating resin sheet 42 interposed between the first insulating resin sheet 41 and the heat sink block 3, the second insulating resin sheet 42 was bonded to the first insulating resin sheet 41 by thermal compression and the heat sink block 3 was bonded to the second insulating resin sheet 42 by thermal compression under the following conditions: 180 degrees C., five minutes, and 5 MPa. For the second insulating resin sheet 42, one that comprised a thermosetting resin, whose size was the same as the heat sink block 3, and whose thickness t was 0.1 mm was used. The second insulating resin sheet 42 had half the thickness of the predetermined requisite thickness required of the insulating resin sheet 4.

It is noted that the size of the second insulating resin sheet 42 need only be equal to or greater than that of the heat sink block 3, and there is no need for it to be identical. Further, the respective thicknesses of the first insulating resin sheet 41 and the second insulating resin sheet 42 are not limited to half the predetermined requisite thickness, and the thickness of the first insulating resin sheet 41 need only be equal to or greater than the thickness of the second insulating resin sheet 42.

(3) Soldering Step (Solder Reflow Step)

Solder reflow was performed using a soldering device that is not shown in the drawings.

Under such conditions that the respective bonding interfaces with the first insulating resin sheet 41 and the second insulating resin sheet 42 would not separate (250 degrees C. for three minutes in the present case), solder and a device were mounted on the heat sink block 3.

(4) Wire Bonding Step and Molding Step

The housing 8 was bonded onto the cooler 5 with an adhesive, and a wire was bonded to the device, etc., where necessary. Further, using an encapsulation epoxy resin for use in electronics as the encapsulation material 7, the semiconductor chip 2, the heat sink block 3 and the insulating resin sheet 4 were buried and encapsulated within the housing 8.

The materials used for and the geometry of the power module 1 are indicated below.

Material: heat sink block—copper (Cu); cooler—copper (Cu).
Thickness: heat sink block—t 3 mm; cooler—t 3 mm; first insulating resin sheet—t 0.1 mm; second insulating resin sheet—t 0.1 mm.
Insulating resin sheet: filler—BN; binder—epoxy resin; thermal conductivity—10 W/mK.
Solder: Pb-free solder (melting point=approximately 230 degrees C.).
Housing: made of PPS resin, and bus bar is made of copper (Cu).
Adhesive: general-purpose silicone adhesive.
Wire: Aluminum (Al).
Encapsulation material: encapsulation epoxy resin for use in electronics.

In the present example, temperature cycling for evaluating the cold/heat resistances of an article of the present invention and a prior art article was conducted.

FIG. 2 is a diagram showing the results of the temperature cycling for an article of the present invention and a prior art article in a comparative table.

Figure 3:
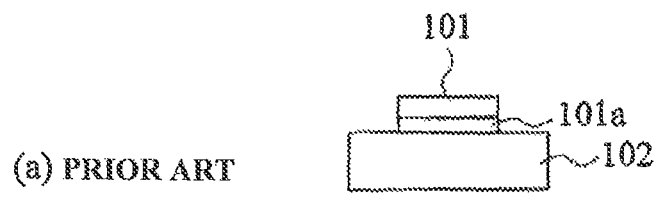
FIG. 3 is a view illustrating a conventional power module production method.
Figure 3:
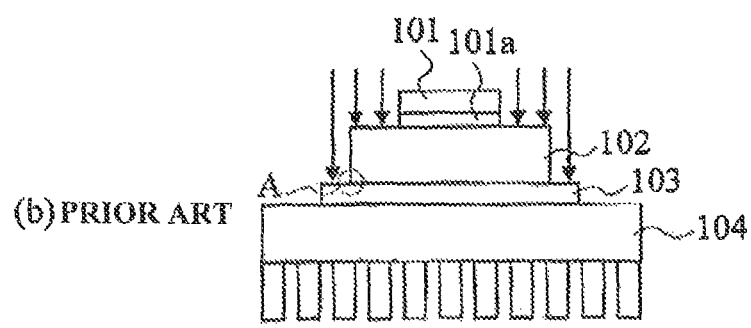
Figure 3:
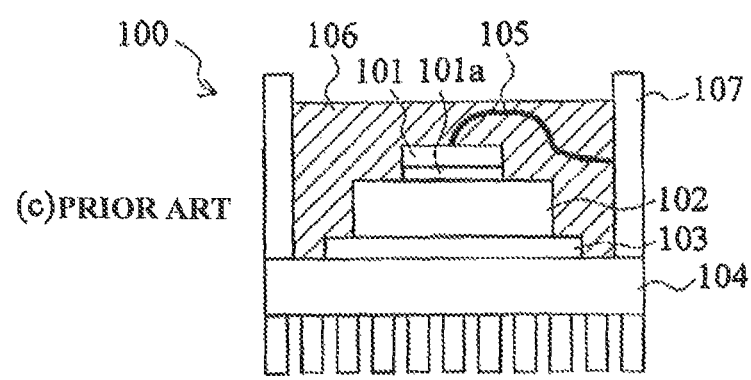
Figure 4:
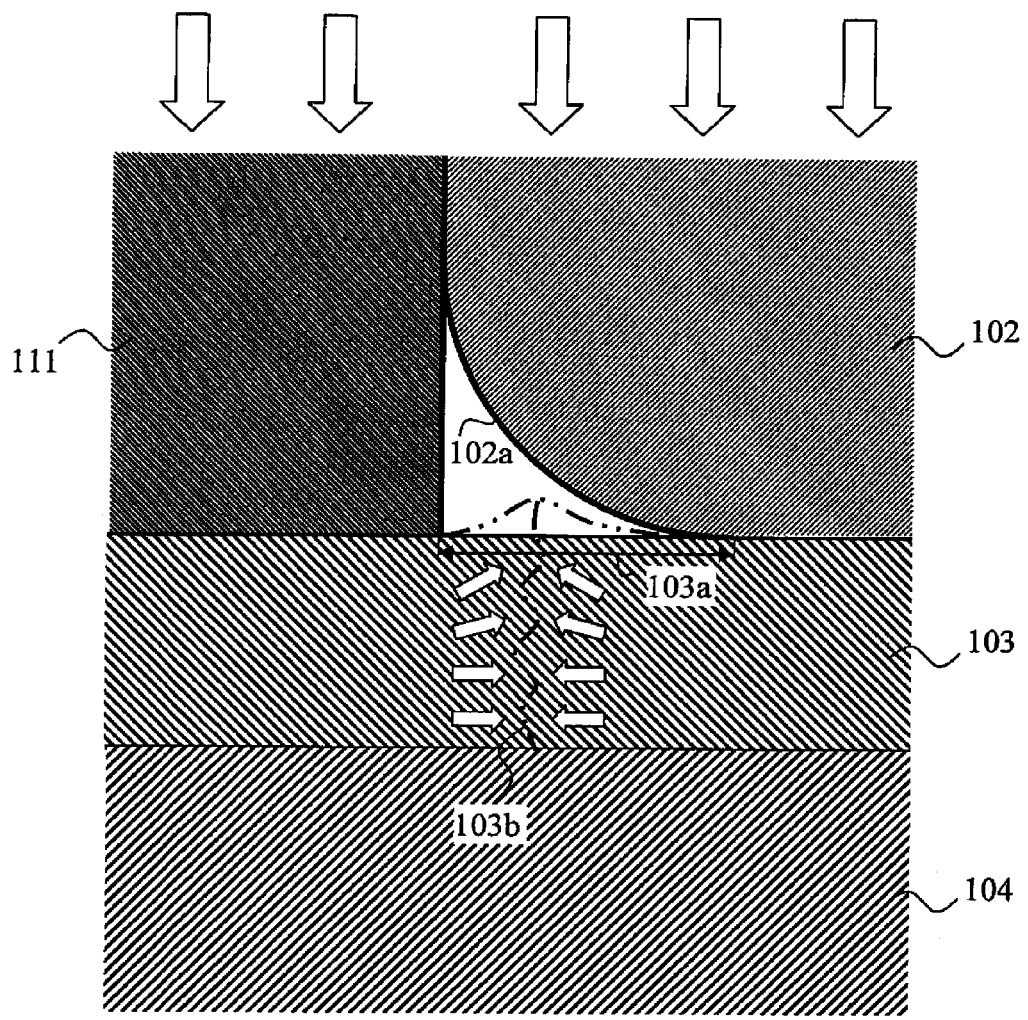
FIG. 4 is an enlarged view of portion A in FIG. 3.

An article of the present invention is a power module produced by a power module production method of the present invention, and a prior art article is a power module produced by the conventional method shown in FIG. 3. Temperature cycling was conducted by repeating a certain cycle (cyc) 3,000 times, where each cycle (cyc) comprised a step in which an article of the present invention and a prior art article were immersed for five minutes in a liquid with a temperature of −40 degrees C. stored in a liquid tank and a step in which they were held for five minutes in a furnace heated to 105 degrees C. The bonding rates of the bonding interfaces, internal cracks in the insulating resin sheet, and the dielectric breakdown voltage were evaluated initially and upon completion of 3,000 cycles.

The various bonding rates shown in the table in FIG. 2 were computed by performing an image analysis on an ultrasonic flaw detection image with respect to each of the bonding interface between the cooler 5 and the first insulating resin sheet 41, and the bonding interface between the second insulating resin sheet 42 and the heat sink block 3.

As shown in FIG. 2, with respect to the article of the present invention, the bonding rate between the cooler 5 and the first insulating resin sheet 41 and the bonding rate between the second insulating resin sheet 42 and the heat sink block 3 were both 100% even after 3,000 cycles (cycs), and the results thus demonstrated that the bonding interfaces has good durability.

On the other hand, with the prior art article, while the bonding rate between the cooler 5 and the first insulating resin sheet 41 and the bonding rate between the second insulating resin sheet 42 and the heat sink block 3 were both initially 100%, the bonding rate between the cooler 5 and the first insulating resin sheet 41 dropped to 93% after 3,000 cycles (cycs), and the bonding rate between the second insulating resin sheet 42 and the heat sink block 3 to 86%. It may be understood therefrom that as a result of performing cooling/heat treatments, stress was exerted due to the difference in linear expansion between the heat sink block 3 and the cooler 5, thereby causing separation at the respective bonding interfaces. Thus, it can be seen that the article of the present invention has improved bonding rates relative to the prior art article.

Further, with respect to the article of the present invention, no internal cracks were present (none) in the insulating resin sheet 4 initially or after 3,000 cycles (cycs), and the results thus demonstrated that the insulating resin sheet 4 has good durability. On the other hand, with the prior art article, internal cracks were found (present) in the insulating resin sheet 4 both initially and after 3,000 cycles. It may be understood therefrom that as a result of pressing the heat sink block 3 and the lateral portions of the insulating resin sheet 4, stress concentrated locally at the insulating resin sheet 4 along the end edges of the heat sink block 3, thereby causing internal cracks.

Further, with respect to the article of the present invention, when a dielectric breakdown voltage of AC 50 Hz was applied, dielectric breakdown did not occur initially or after 3,000 cycles even at voltages exceeding 5 kV. In contrast, with the prior art article, dielectric breakdown occurred both initially and after 3,000 cycles at voltages short of 2 kV. Thus, it can be seen that the article of the present invention has improved dielectric strength relative to the prior art article.

Reference Signs List
1 Power module
2 Semiconductor chip
2a Solder portion
3 Heat sink block
4 Insulating resin sheet
41 First insulating resin sheet
42 Second insulating resin sheet
5 Cooler
W Work

The invention claimed is:

1. A power module production method for producing a power module by stacking a cooler, an insulating resin sheet, a heat sink block, and a semiconductor chip, the power module production method comprising:

a first thermal compression bonding step in which a first insulating resin sheet, which forms a lower layer of the insulating resin sheet, is bonded to the cooler by thermal compression;

a second the thermal compression bonding step in which a second insulating resin sheet, which forms an upper layer of the insulating resin sheet, is interposed between the first insulating resin sheet and the heat sink block, the second insulating resin sheet is bonded to the first insulating resin sheet by thermal compression, and the heat sink block is bonded to the second insulating resin sheet by thermal compression; and a soldering step in which the semiconductor chip is soldered onto the heat sink block, wherein:

the first insulating resin sheet and the second insulating resin sheet each comprise a thermosetting resin material, in the first thermal compression bonding step, heating is performed to a temperature at which the first insulating resin sheet thermally cures, and in the second thermal compression bonding step, heating is performed to a temperature at which the second insulating resin sheet thermally cures.

2. The power module production method according to claim 1, wherein the first insulating resin sheet has a size that is greater than that of the heat sink block, and a thickness that is equal to or greater than the thickness of the second insulating resin sheet.

* * * * *